(12) United States Patent
Rogers

(10) Patent No.: US 6,533,445 B1
(45) Date of Patent: Mar. 18, 2003

(54) VEHICLE LIGHT

(76) Inventor: Thomas W. Rogers, 1534 Rosella Ct., Brentwood, TN (US) 37027

( * ) Notice: Subject to any disclaimer, the term of this patent is extended or adjusted under 35 U.S.C. 154(b) by 0 days.

(21) Appl. No.: 10/094,912

(22) Filed: Mar. 11, 2002

(51) Int. Cl.[7] .................................................. B60Q 1/26
(52) U.S. Cl. ...................... 362/540; 362/485; 362/497; 362/545; 362/487
(58) Field of Search .................................. 362/540, 543, 362/544, 545, 549, 497, 541, 240, 485, 487, 370; 116/28

(56) References Cited

U.S. PATENT DOCUMENTS

| | | | | |
|---|---|---|---|---|
| 1,513,300 A | * | 10/1924 | Vose ........................... | 362/497 |
| 1,526,868 A | * | 2/1925 | Petrovich ..................... | 362/497 |
| 1,567,193 A | * | 12/1925 | Ritz-Woller ................. | 362/497 |
| 1,887,087 A | * | 11/1932 | Frizner ......................... | 40/209 |
| 5,150,959 A | | 9/1992 | Paffrath et al. ............... | 362/80 |
| 5,567,036 A | * | 10/1996 | Theobald et al. ........... | 362/485 |
| 5,896,084 A | | 4/1999 | Weiss et al. ................. | 340/468 |
| 6,095,663 A | * | 8/2000 | Pond et al. .................. | 362/247 |

* cited by examiner

Primary Examiner—Alan Cariaso
Assistant Examiner—Ali Alavi
(74) Attorney, Agent, or Firm—Charles M. Kaplan

(57) ABSTRACT

A unitary multiple light assembly for motor vehicle trailers uses different arrays of LEDs to illuminate a side marker light, a rear tail or brake light, and a license plate light. A license plate attaching bracket holds the license plate in a location in which individual LEDs in a light fixture can shine directly on predetermined locations on the license plate.

22 Claims, 9 Drawing Sheets

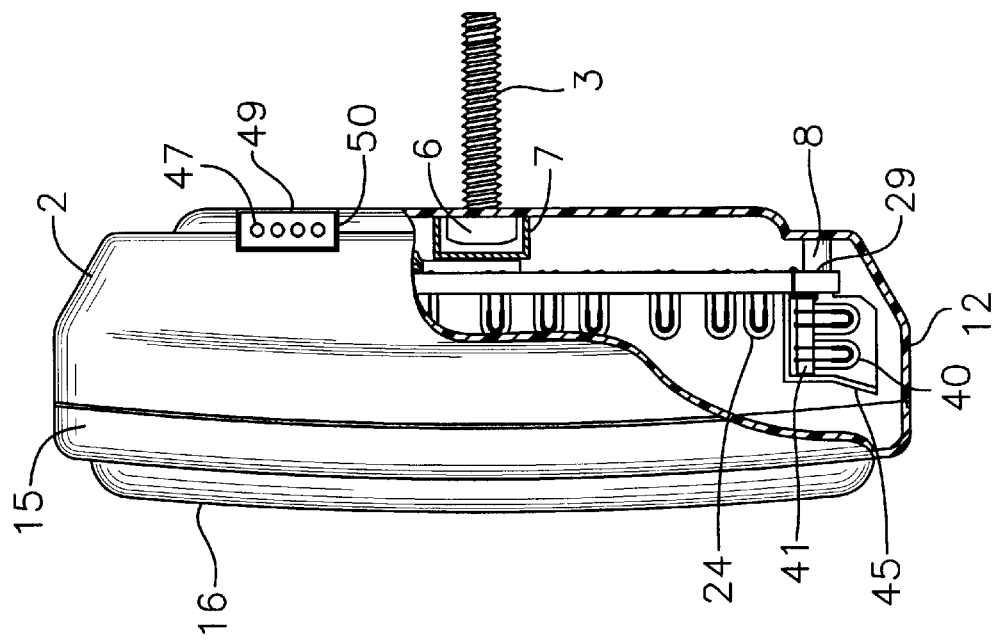
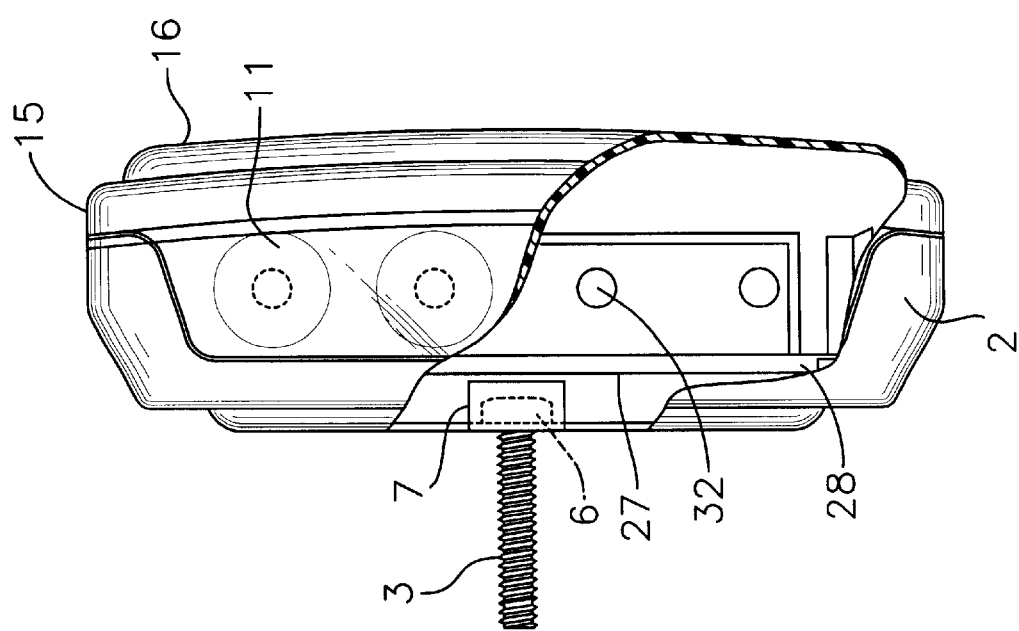

VEHICLE LIGHT

BACKGROUND OF THE INVENTION

This invention relates to rear lights for motor vehicles, and more particularly to lights for boat trailers that will be submerged in water. Although marine trailer lights may be waterproof when they are manufactured, during use of the trailers road hazards and wear may break the seal and permit entry of moisture. Also, when a light has been heated up by exposure to the sun while the trailer is parked, sudden immersion of the trailer into cold lake or river water may cause moisture to condense inside of the trailer lights.

OBJECTIVES OF THE INVENTION

Accordingly, it is an object of this invention to provide improved lights for vehicle trailers.

Another object is to provide a vehicle light assembly that includes a rear tail light, a side marker light and a license plate light in a single fixture.

A further object is to provide a combined vehicle light fixture and license plate holder.

Another object is to enable multiple lighting units that have different functions to be attached to a vehicle at the same time.

An additional object is to provide vehicle light fixtures with sealed arrays of LED's and circuit boards that continue to illuminate when moisture leaks into or condenses in the fixtures.

Another object is to prevent LED's that illuminate license plates from shining through other lenses used to illuminate other functions.

A further object is to seal multiple arrays of LED's and their multiple printed circuit control boards into a single module.

Another object is to provide vehicles with a light fixture that has LEDs that shine on specific locations on license plates attached to the vehicles.

Another object is to provide vehicle light fixtures with LEDs and circuit boards that are insulated so as to enable them to continue to function when the seal on a fixture is broken permitting moisture to enter.

Another object is to employ an insulating sealant to bond together the circuit components of a vehicle light fixture.

Another object is to provide a license plate support bracket that connects a license plate to a light fixture in a way that enables LEDs in the light fixture to shine their light beams directly on locations on the license plate that ensures illumination of all license figures imprinted on the plate.

A further object is to provide multi-function trailer light fixtures that are rugged, economical, highly attractive, easy to use and maintain, and which do not possess defects found in similar prior art vehicle lights.

Other objects and advantages of the motor vehicle lights incorporating this invention will be found in the specification and claims and the scope of the invention will be set forth in the claims.

DESCRIPTION OF THE DRAWING

FIG. 6 is a partially broken away side view of the light shown in FIG. 1.

FIG. 7 is a partially broken away view of the opposite side of the light shown in FIG. 1.

DESCRIPTION OF THE INVENTION

Figure 1A:
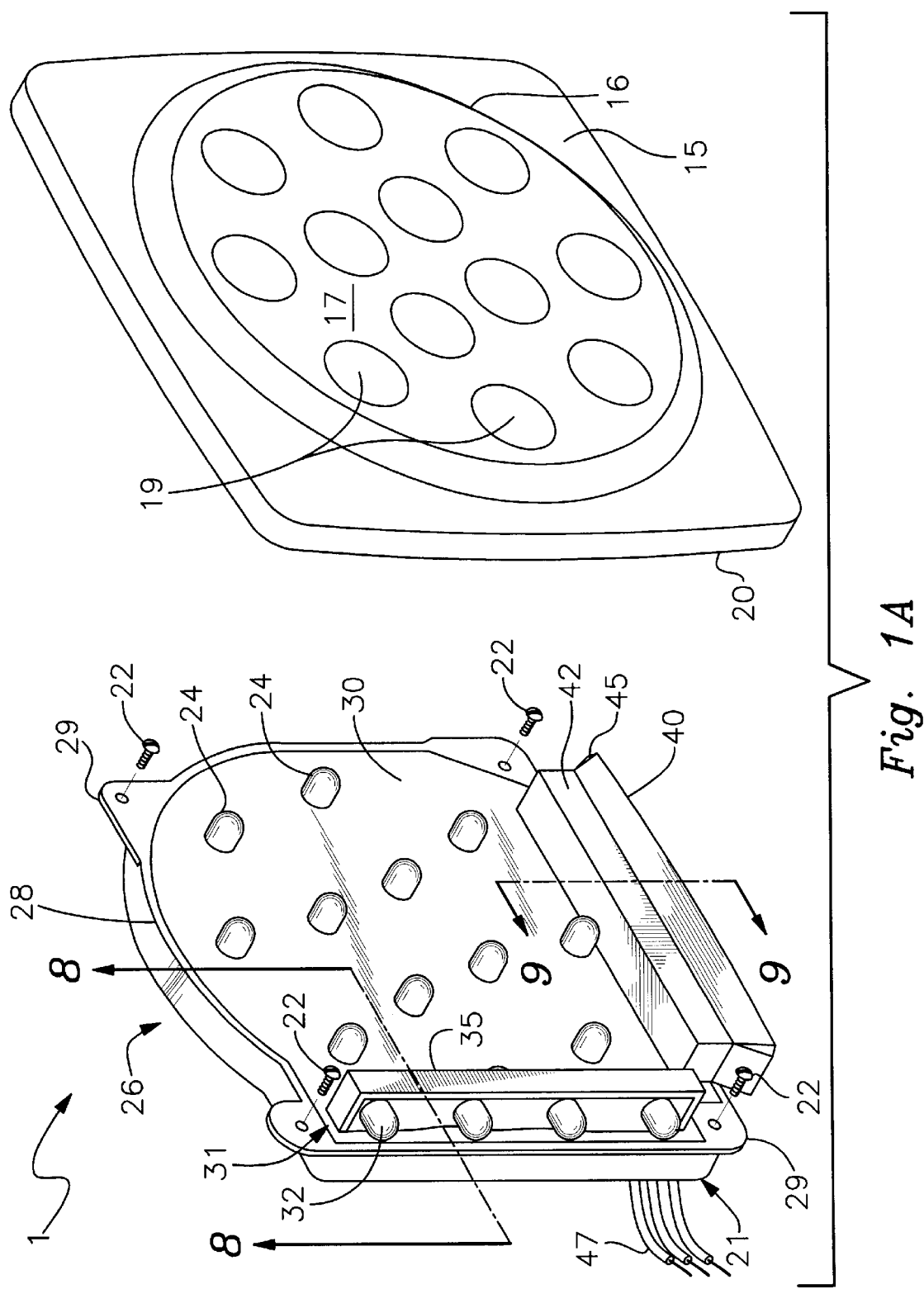
FIGS. 1A and 1B are schematic exploded perspective views of an embodiment of a light in accord with this invention.
Figure 1B:
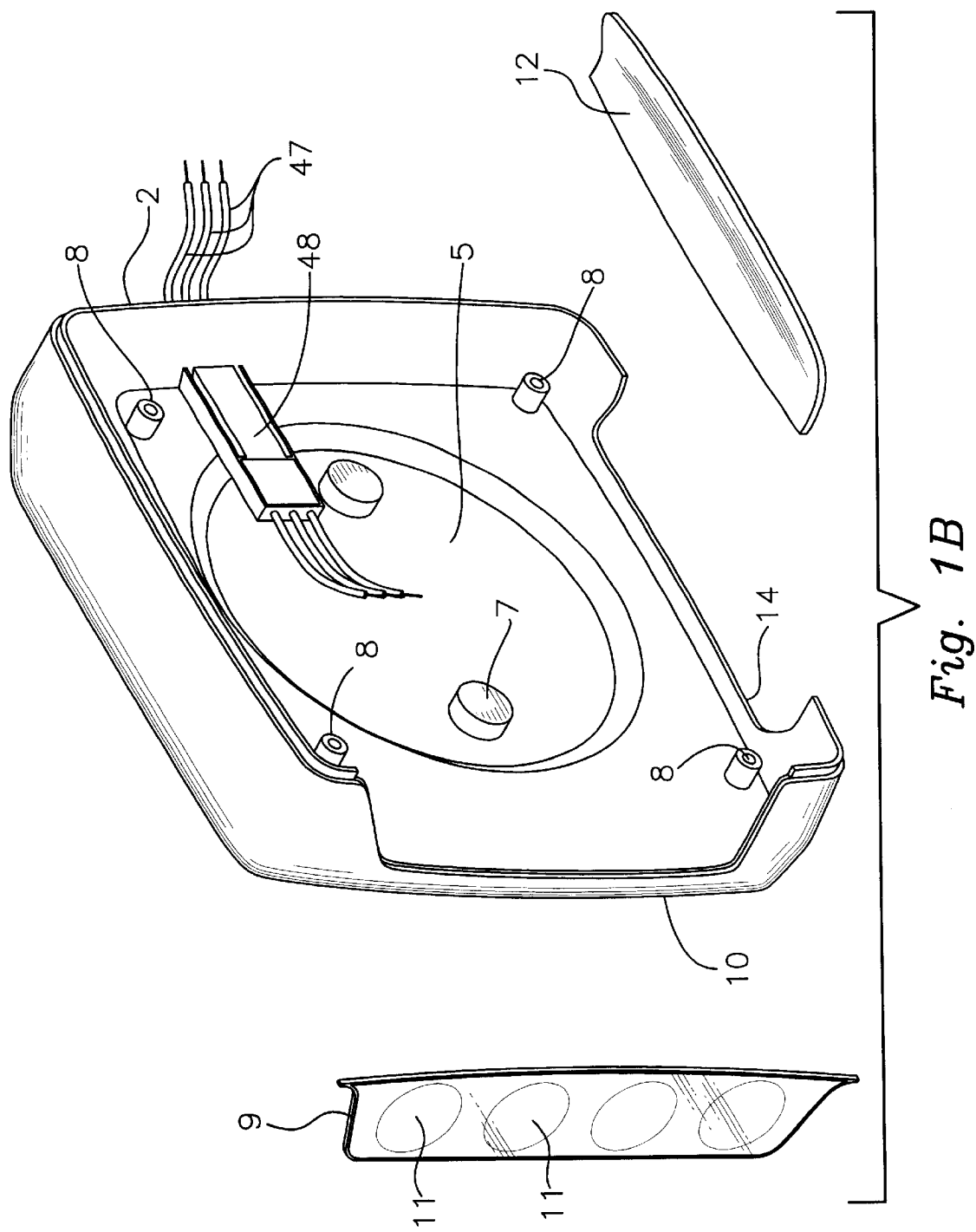
Figure 3:
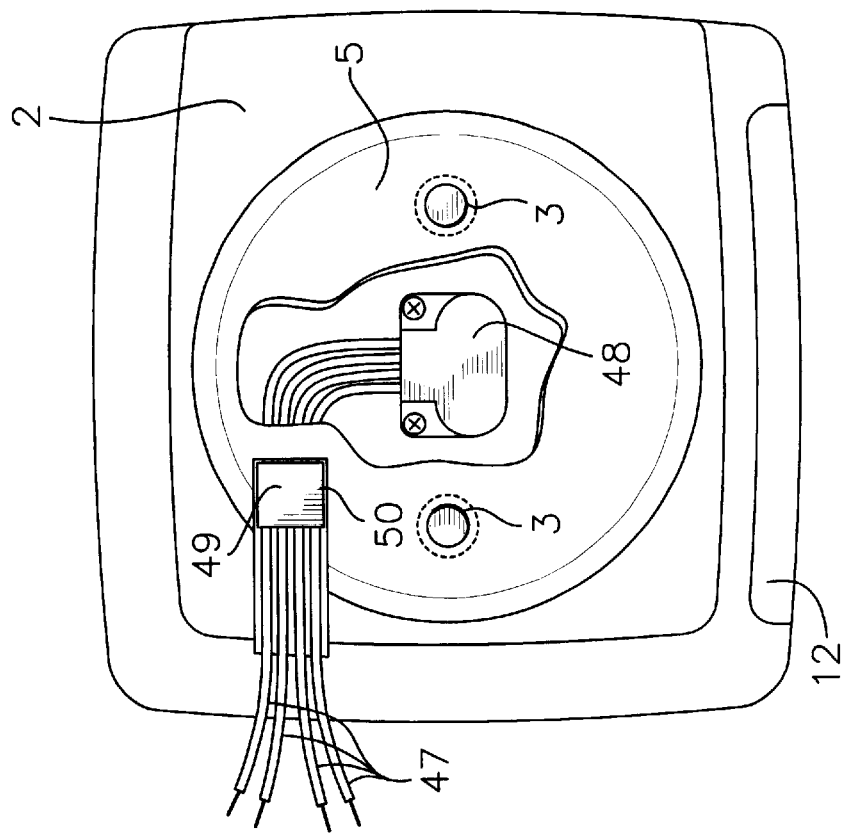
FIG. 3 is a partially broken away rear view of the light shown in FIG. 1.
Figure 2:
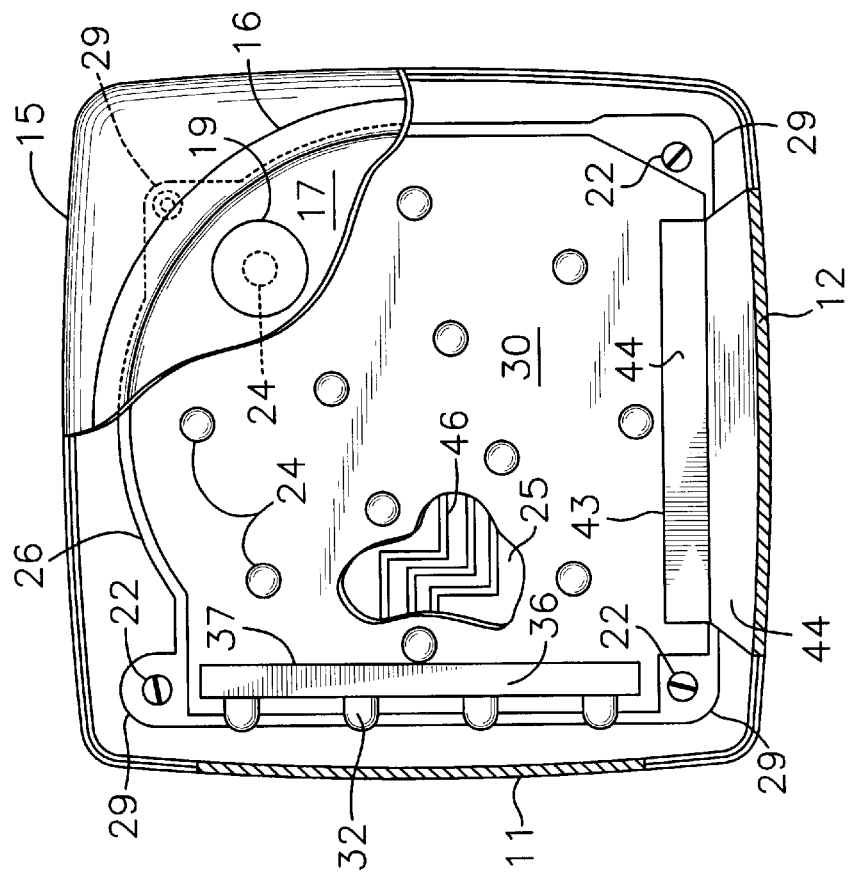
FIG. 2 is a partially broken away front view of the light shown in FIG. 1.
Figure 4:
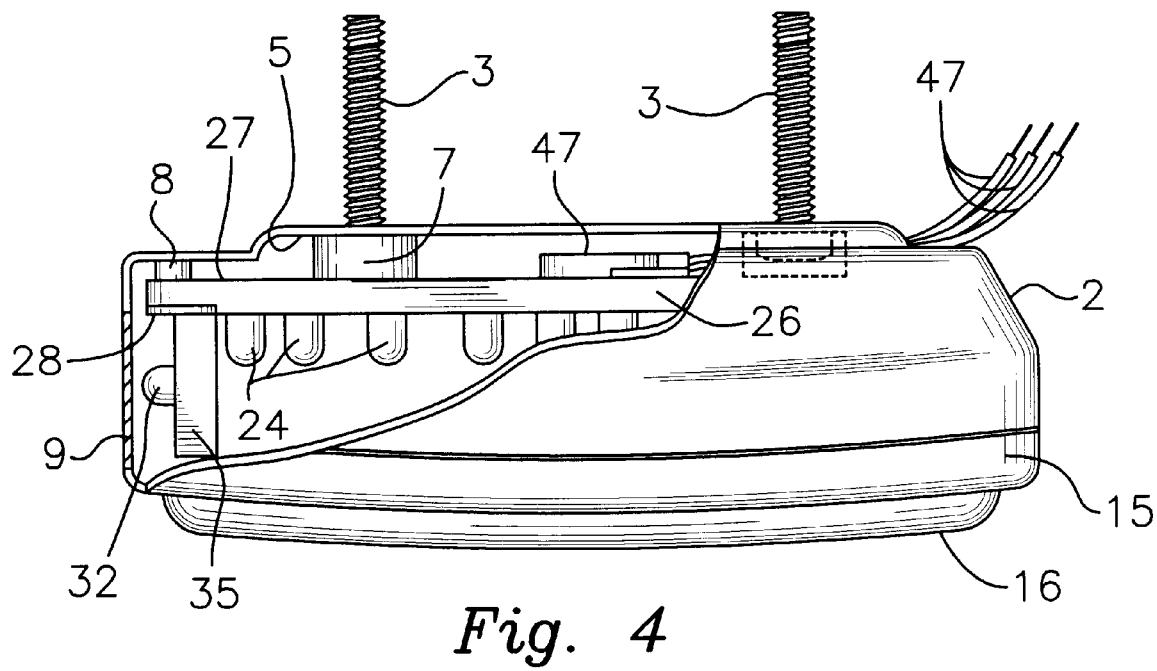
FIG. 4 is a partially broken away top view of the light shown in FIG. 1.
Figure 5:
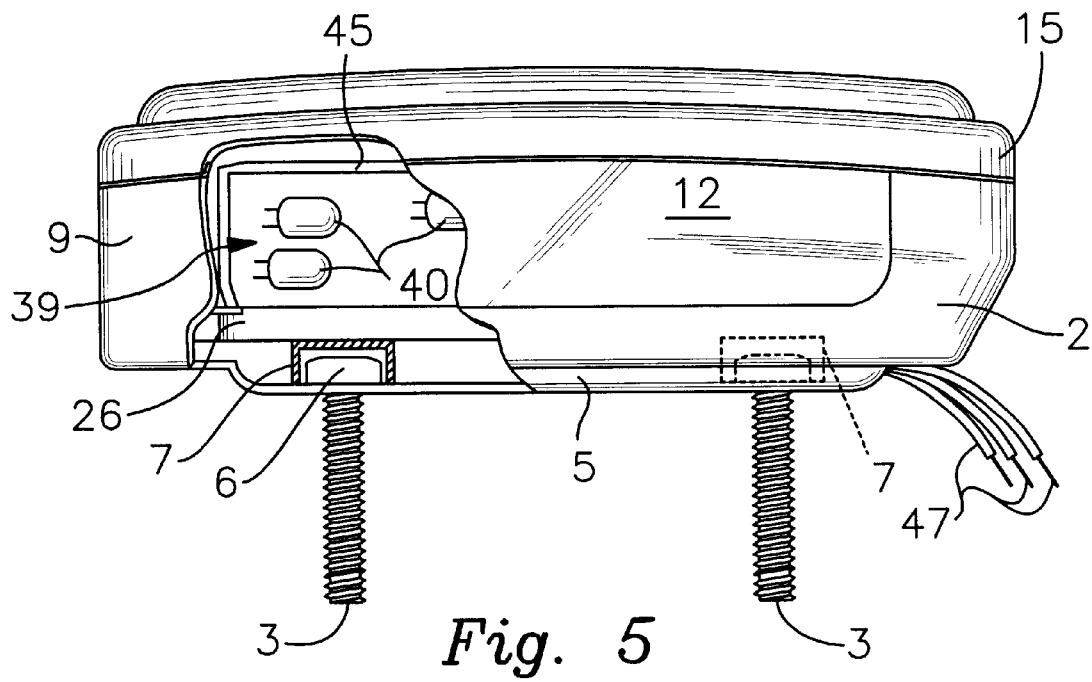
FIG. 5 is a partially broken away bottom view of the light shown in FIG. 1.
Figure 8:
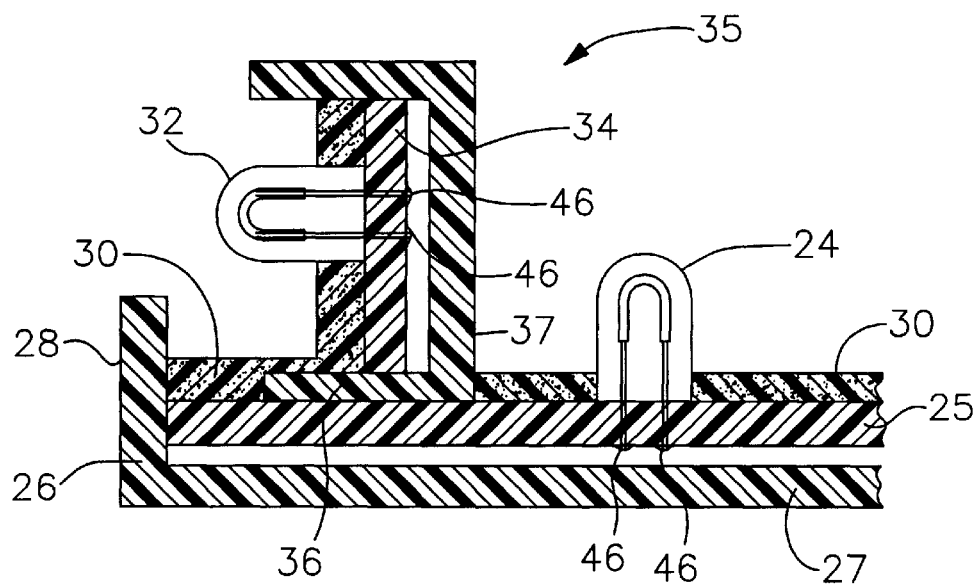
FIG. 8 is an enlarged, cross sectional partial view taken generally along the line 8—8 in FIG. 1.
Figure 9:
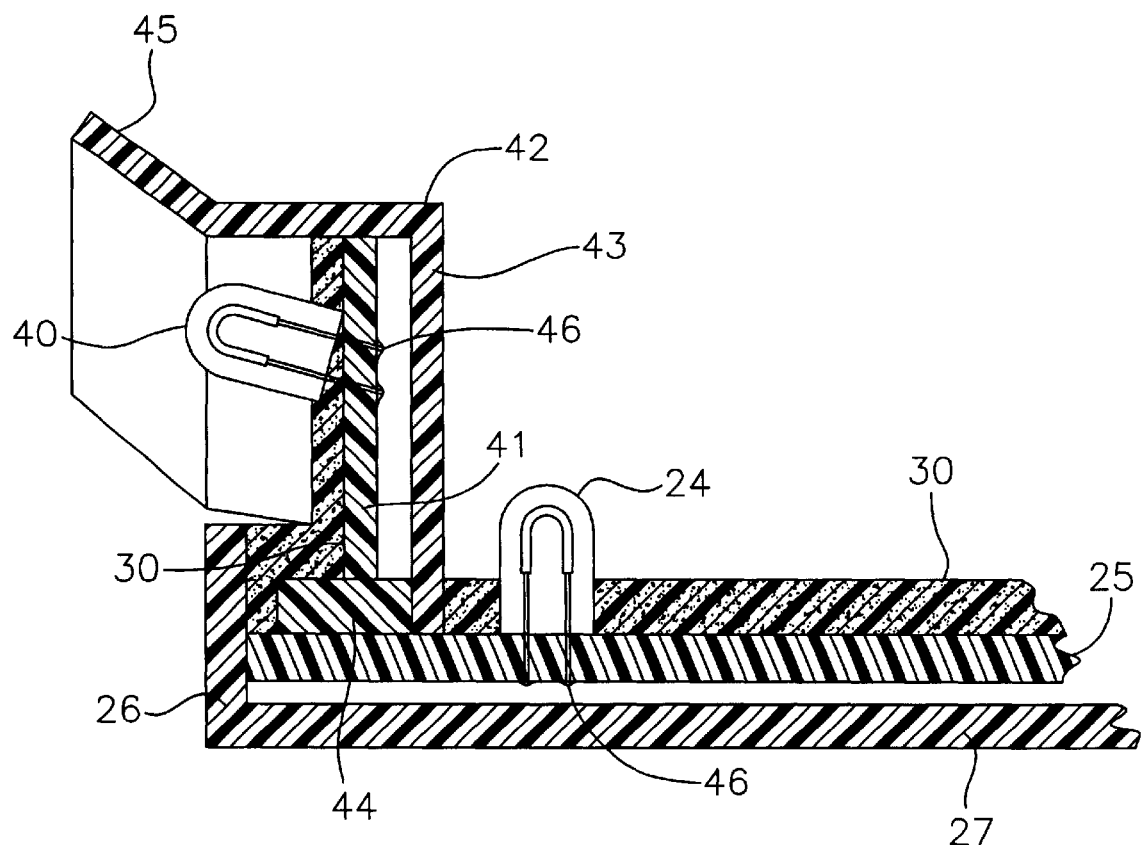
FIG. 9 is an enlarged, cross sectional partial view taken generally along the line 9—9 in FIG. 1.
Figure 10:
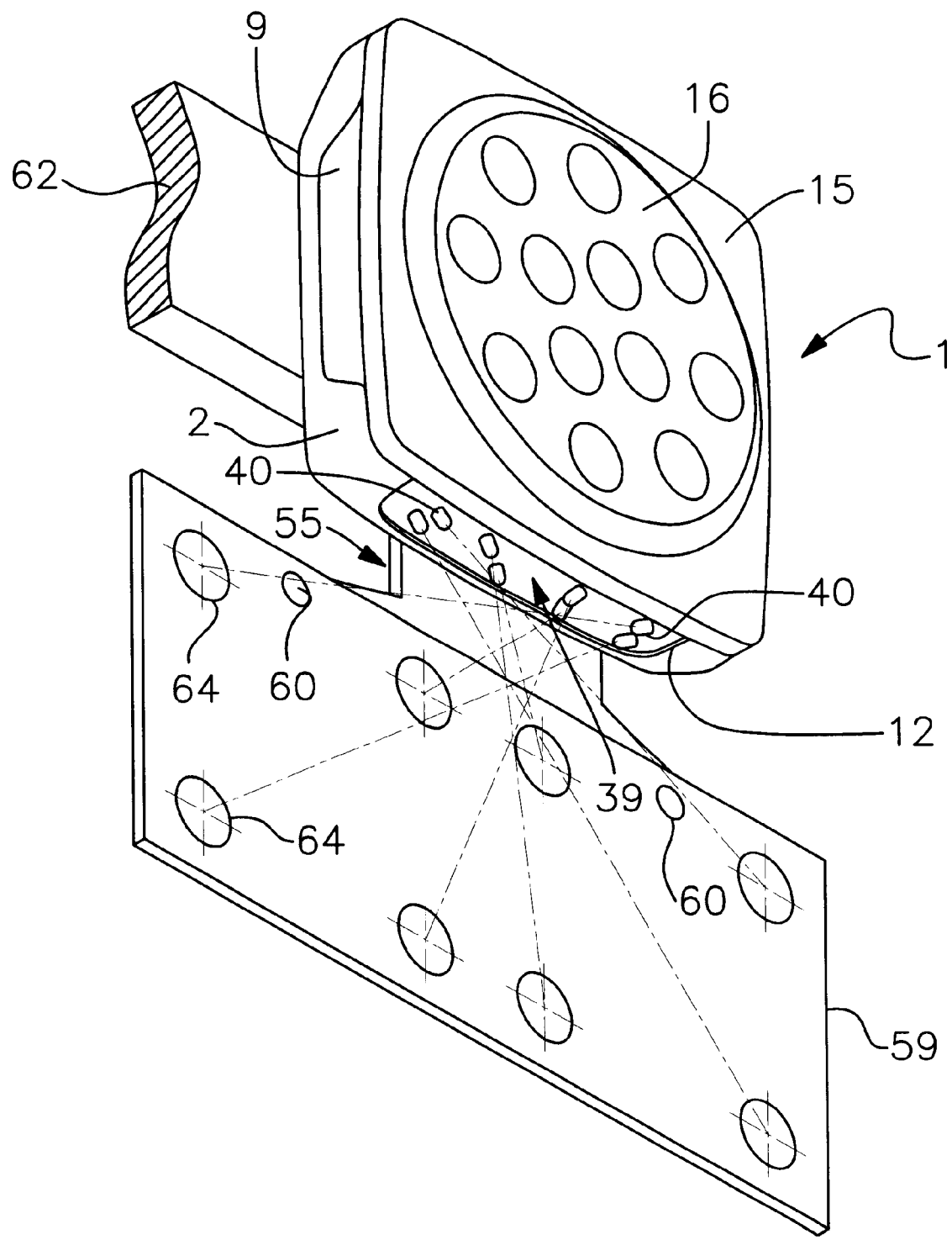
FIG. 10 is a perspective, partially broken away, schematic representation of the light in FIGS. 1–9 in combination with a license plate holder in accord with this invention.
Figure 11:
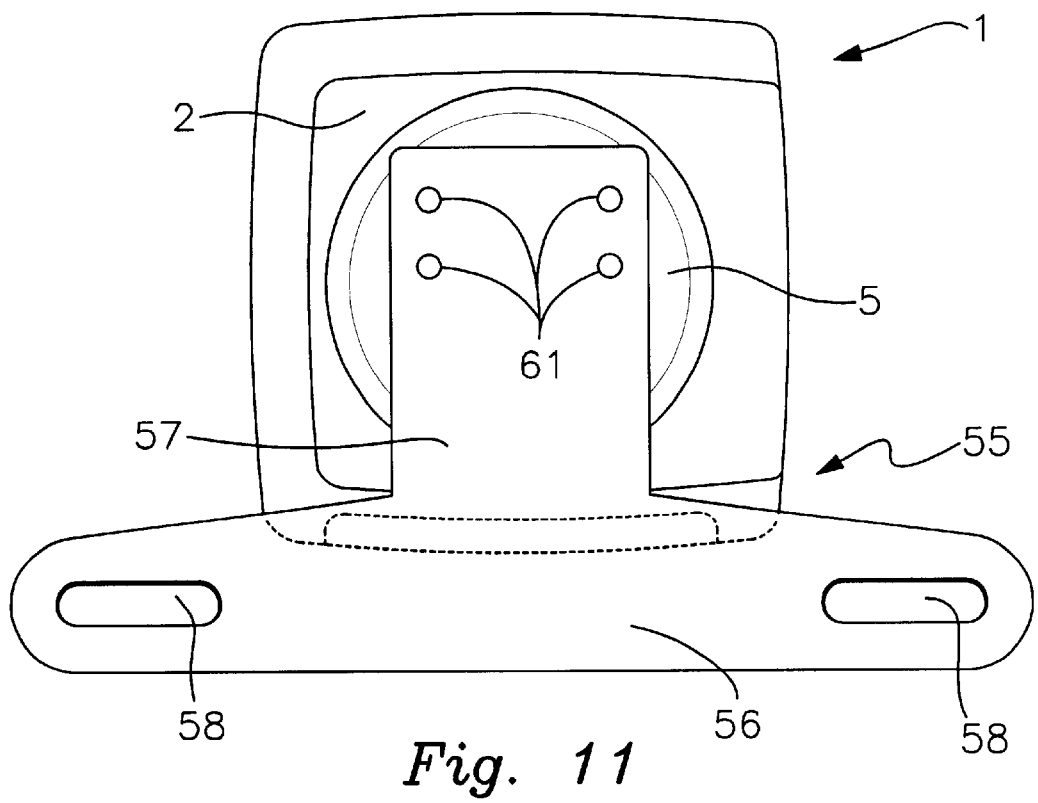
FIG. 11 is a rear view of the combination shown in FIG. 10.

The drawing shows a sealed, waterproof multiple light assembly or fixture 1 for motor vehicle trailers in accord with this invention. A first opaque plastic shell 2 has threaded bolts 3, or other fasteners, extending perpendicularly therefrom for attaching the light to a vehicle. Shell 2 has a central depression 5. The heads 6 of the bolts are sealed and bonded to the shell 2 by plastic cast over them so as to form reinforcing and sealing caps 7 in the depression 5. A plurality of integral outwardly projecting supports or posts 8 are uniformly spaced around the depression 5. A transparent, colored, curved side marker lens 9 is sealed against one side 10 of the shell 2. A plurality of optic shapes 11, which may be circular, are aligned on the lens 9. A curved, transparent clear license plate lens 12 is sealed against another side 14 of shell 2 that is generally perpendicular to the side 10.

A colored, transparent second plastic shell 15 has a protruding, curved, circular, central bulge 16 that defines a tail light lens 17. The lens 17 is generally perpendicular to both the lens 9 and the lens 12. A plurality of circular optic shapes 19 may be arranged symmetrically on the lens 17. The peripheral edge 20 of the shell 15 is sealed against the edges of the shell 2, and the edges of the lenses 9 and 12. The shells 2 and 15 and the lenses 9 and 12 may be made from a durable, water resistant plastic, such as ABS, acrylic or polycarbonate, and these parts may be sealed against each other in a waterproof manner by solvent or electronic welding.

An integral light and circuit module 21 is suspended within the shells 2 and 15. Module 21 has a first array 22 of LEDs (light emitting diodes) 24 that are aimed at the tail light lens 17. Each LED 24 in the array 22 is aimed so that it shines through one of the optic shapes 19. The LEDs in array 22 are electrically connected in conventional manner to a first printed circuit board 25. Array 22 and circuit board 25 are held in a dish 26 that has an essentially flat bottom 27 and an outwardly projecting peripheral rim 28 that completely surrounds its bottom. Integral tabs 29 that align with post 8 project away from rim 28. A thread fastener such as a screw 23 may pass through each tab 29 into a post 8 so that the bottom 27 of dish 26 is securely held above the shell 2.

Module 21 includes a second array 31 of LEDs 32 that are aimed at the side marker lens 9. Each LED in the array 31 is aimed so that it shines through one of the optic shapes 19. The LEDs in array 31 are electrically connected in conventional manner to a second printed circuit board 34. Array 31 and circuit board 34 are held in an open-ended rectangular pod 35 that is generally perpendicular to the dish 26. Pod 35 has outwardly extending sides 36 and a back 37. The LEDs 32 in array 31 extend through the open end beyond the sides 36.

Module 21 also includes a third array 39 of LEDs 40 that are aimed at the license plate lens 12. The LEDs in array 39 are electrically connected in conventional manner to a third printed circuit board 41. Array 39 and circuit board 41 are held in a shroud 42 that is generally perpendicular to the dish 26. Shroud 42 is made from a rectangular receptacle that has a back 43, outwardly extending sides 43 and an open end through which the LEDs 40 shine light at lens 12. A integral three-sided canopy 45 projects past the LEDs 40 so as to shield the lenses 9 and 11 from light shined by these LEDs.

A waterproof sealant 30, such as an epoxy resin, is used to prevent moisture from interfering with the operation of the fixture 1. The pod 35 may be placed on it back 37 and sealant poured into its open end. The sealant 30 partially fills pod 35 so as to completely cover the circuit board 34 and the lower portion of all of the LEDs in array 31. The shroud 42 may be placed on it back 43 and sealant poured into its open end. The sealant 30 partially fills shroud 42 so as to completely cover the circuit board 41 and the lower portion of all of the LEDs in array 39. The sealed pod 35 and shroud 42 may then be placed in the dish 26 with one side 36 of the pod 35 and one side 44 of the shroud on the top of the circuit board 25. Additional sealant 30 may then be poured into the dish 26 to partially fill the dish and completely cover the circuit board 25 and the lower portion of all of the LEDs in array 22. The sealant in dish 26 also completely covers the sides of the pod and shroud in contact with board 25 so as to bond the pod and shroud to the dish 26 and board 25.

The circuit boards 25, 35 and 41 have conductors 46 printed on either side thereof and may be electrically connected in conventional manner to insulation-coated wire conductors 47 for connecting the light assembly 1 to the electrical system of the vehicle to which the light is attached. The conductors 47 extend from a terminal 48 attached to the outside of the dish bottom 27. Because of the manner in which the module 21 is suspended on the post 8, the conductors 47 can pass through the space beneath the dish 26 into a flexible gasket 49 that seals an exit opening 50 in the shell 2. The gasket 49 also provides a water proof seal around the conductors 47. The circuitry connecting the above described LEDs and printed circuit boards may contain additional electrical components, such as resisters, capacitors and wires, that have not been illustrated because the use of such components and the circuitry is conventional and is not a part of the invention claimed herein. All components of the circuitry within the fixture 1 are coated with waterproof insulation and/or are covered by the sealant 30, so that entry of moisture from a leak or from condensation will not affect the operation of the LEDs.

Another aspect of this invention is shown in FIGS. 10–13. The light fixture 1 disclosed in FIGS. 1–9 has been combined with a unitary plastic bracket 55 that has an essentially horizontal beam 56 and an integral essentially vertically extending flange 57. Aligned slots in the beam 56 provide first openings 58 for attaching a license plate 59 to the beam. Bolts 60 and nuts may be used to attach the license plate to the beam. The flange 57 has pairs of aligned holes that provide second openings 61 for connecting the bracket 55 to the fixture 1. The bolts 3 on the fixture 1 pass through the openings 61 and then through holes in some part of the frame 62 of a vehicle where nuts 63 attach the fixture 1, bracket 55 and license plate 59 to the vehicle.

Figure 13:
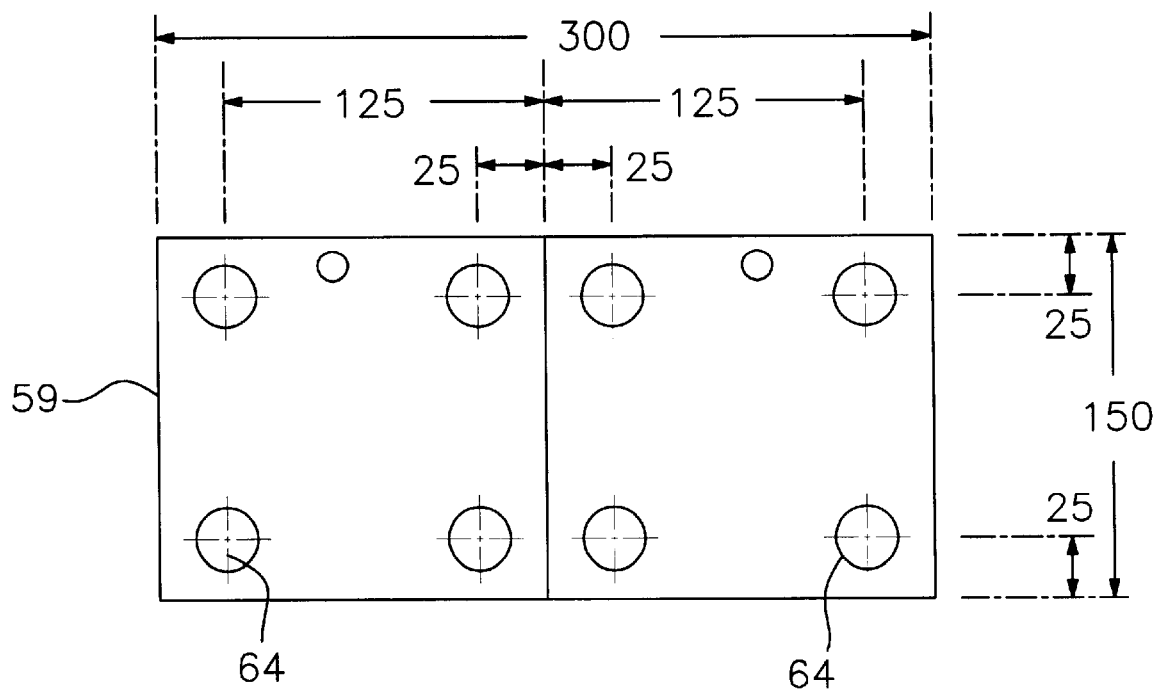
FIG. 13 is a schematic representation of a license plate targeted by lights aimed in accord with this invention.
Figure 12:
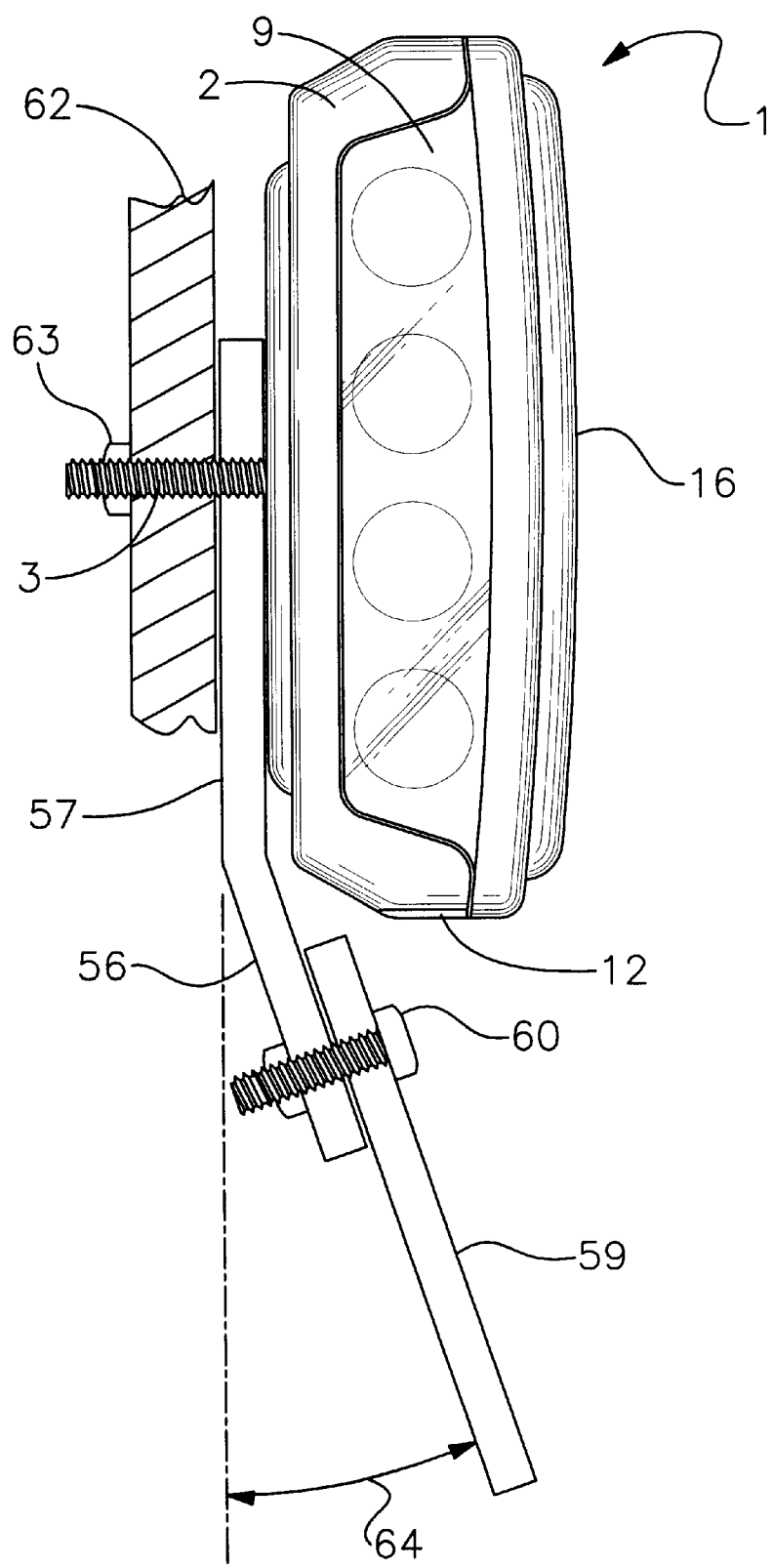
FIG. 12, is a side view of the combination shown in FIG. 10.

As shown in FIG. 12, the beam 56 extends at an acute angle 64 to the vertical flange 57. This causes the bracket 55 to hold the license plate 59 at the same acute angle to the vertical directly below the license plate lens 12. The third array may comprise eight LEDs 40, each of which is aimed to shine a beam of light through the lens 12 at a specific predetermined location 64 on the license plate 59. FIG. 13 gives an example of where the selected locations 64 can be located on a license plate having dimensions of approximately six inches by twelve inches. The numbers in FIG. 13 are in millimeters and the diameter of the circular locations 64 are also in millimeters. The angle 64 is preferably in the range of about five to fifteen degrees, and for example may be about ten degrees as shown in the drawing. This combination enables the LEDs 40 to shine directly on locations on the license plate 59 that will ensure that the numerals and letters imprinted on the license plate will be clearly visible.

While the present invention has been described with reference to particular embodiments, it is not intended to illustrate or describe all of the equivalent forms or ramifications thereof. Also, the words used are words of description rather than limitation, and various changes may be made without departing from the spirit or scope of the invention disclosed herein. The words parallel and perpendicular should be interpreted in their general sense because surfaces of the shell 2 and 25, the lenses 9 and 12, and the rim 28 all are curved. It is intended that the appended claims cover all such changes as fall within the true spirit and scope of the invention.

I claim:

1. A multiple light assembly for vehicles, comprising:
   a first shell having a colored side marker lens on one side thereof, and a clear license plate lens on a side of said first shell that is generally perpendicular to said one side of said first shell;
   a second shell comprising a colored tail light lens that is generally perpendicular to both said side marker lens and said license plate lens; said second shell having an edge that is sealed against said first shell and said side marker lens and said license plate lens;
   a light and circuit module between said first and second shells, said module having a first array of LEDs aimed at said tail light lens, said first array of LEDs being connected to a first printed circuit board, said module having a second array of LEDs aimed at said side marker lens, said second array of LEDs being connected to a second printed circuit board, said module having a third array of LEDs aimed at said license plate lens, said third array of LEDs being connected to a third printed circuit board, said first, second and third printed circuit boards being connected to conductors for connecting said light assembly to a vehicle electrical system; and
   a waterproof sealant covering said first, second and third printed circuit boards and a portion of each LED.

2. The multiple light assembly defined in claim 1, further comprising: a plurality of supports integral with said first shell that project toward said second shell and fasteners attaching said light and circuit module to said supports.

3. The multiple light assembly defined in claim 2, wherein said supports suspend said light and circuit module away from said first shell so as to provide a space between said light and circuit module and said first shell for said conductors to pass from said light and circuit module through said first shell.

4. The multiple light assembly defined in claim 1, further comprising: fasteners extending from said first shell for attaching said multiple light assembly to a vehicle, there being a central depression in said first shell, and said fasteners having enlarged heads sealed against said first shell in said central depression.

5. The multiple light assembly defined in claim 1, further comprising: means for connecting a license plate to said light assembly at an angle to vertical below said license plate lens, and each of said LEDs in said third array being aimed to shine on a predetermined location on an attached license plate.

6. A multiple light assembly for vehicles, comprising:
a first shell having a colored side marker lens on one side thereof, and a clear license plate lens on another side thereof that is generally perpendicular to said one side;
a second shell comprising a colored tail light lens that is generally perpendicular to both said side marker lens and said license plate lens, said first and second shells being sealed together;
a light and circuit module between said first and second shells comprising:
  a first array of LEDs aimed at said tail light lens, said first array of LEDs being connected to a first printed circuit board, said first array of LEDs and said first printed circuit board being held in a dish that is generally parallel to said tail light lens, a waterproof sealant partially filling said dish so as to cover said first printed circuit board and a portion of said first array of LEDs;
  said module having a second array of LEDs aimed at said side marker lens, said second array of LEDs being connected to a second printed circuit board, said second array of lights and said second printed circuit board being held in a pod that is generally perpendicular to said dish and generally parallel to said directional signal lens, a waterproof sealant partially filling said pod so as to cover said second printed circuit board and a portion of said second array of LEDs;
  said module having a third array of LEDs aimed at said license plate lens, said third array of LEDs being connected to a third printed circuit board, said third array of LEDs and said third printed circuit board being held in a shroud that is generally perpendicular to said dish and generally parallel to said tail light lens, a waterproof sealant partially filling said shroud so as to cover said third printed circuit board and a portion of said third array of LEDs, and said shroud essentially preventing the LEDs in said third array from shining through said tail light lens and said side marker lens; and
conductors for connecting said printed circuit boards to a vehicle electrical system.

7. The multiple light assembly defined in claim 6, wherein said pod comprises a rectangular receptacle having one side bonded to said dish by said sealant, and an open side through which said LEDs extend.

8. The multiple light assembly defined in claim 6, wherein said shroud comprises a rectangular receptacle having one side bonded to said dish by said sealant, an open side through which said LEDs shine light, and an integral three-sided canopy that projects past said LEDs so as to shield said side marker lens and said tail light lens from the light shined by the LEDs in said shroud.

9. The multiple light assembly defined in claim 6, further comprising, said dish being completely surrounded by an outwardly projecting peripheral rim, and said sealant that covers said first circuit board and said first array of LED's being contained within said peripheral rim.

10. The multiple light assembly defined in claim 9, wherein said said pod and said shroud each have a side that is bonded to said dish by sealant confined within said peripheral rim.

11. A sealed, waterproof multiple light fixture for vehicles, comprising:
a first plastic shell having fasteners extending therefrom for attaching said fixture to a vehicle; a colored side marker lens on one side of said first shell; and a clear license plate lens on a side of said first shell that is generally perpendicular to said one side of said first shell;
a second plastic shell comprising a colored tail light lens that is generally perpendicular to both said side marker lens and said license plate lens; said second shell having an edge that is sealed against said first shell, said side marker lens and said license plate lens;
a light and circuit module suspended between said first and second shells, comprising:
  a first array of LEDs aimed at said tail light lens, said first array of LEDs being connected to a first printed circuit board, said first array of LEDs and said first printed circuit board being held in a dish that is generally parallel to said tail light lens, a waterproof sealant partially filling said dish so as to completely cover said first printed circuit board and a portion of said first array of LEDs;
  said module having a second array of LEDs aimed at said side marker lens, said second array of LEDs being connected to a second printed circuit board, said second array of lights and said second printed circuit board being held in a pod that is generally perpendicular to said dish and generally parallel to said side marker lens, a waterproof sealant partially filling said pod so as to completely cover said second printed circuit board and a portion of said second array of LEDs;
  said module having a third array of LEDs aimed at said license plate lens, said third array of LEDs being connected to a third printed circuit board, said third array of LEDs and said third printed circuit board being held in a shroud that is generally perpendicular to said dish and generally parallel to said tail light lens, a waterproof sealant partially filling said shroud so as to cover said third printed circuit board and a portion of said third array of LEDs, and said shroud essentially preventing the LEDs in said third array from shining through said tail light lens and said side marker lens; and
said first, second and third printed circuit boards being connected to conductors for connecting said light assembly to a vehicle electrical system.

12. The multiple light fixture defined in claim 11, further comprising: a plurality of supports integral with said first shell that extend toward said second shell, said dish being completely surrounded by an outwardly extending peripheral rim having tabs projecting therefrom, fasteners passing through said tabs into said supports attaching said light and circuit module to said supports, said supports suspending said light and circuit module away from said first shell so as to provide a space between said light and circuit module and said first shell for said conductors to pass from said light and circuit module through said first shell.

13. The multiple light assembly defined in claim 11, further comprising: means for connecting a license plate to said light fixture at an angle to vertical below said license plate lens, and each of said LEDs in said third array being aimed to shine on a predetermined location on an attached license plate.

14. The multiple light fixture defined in claim 11, further comprising: said first shell having a central depression, said fasteners having enlarged heads sealed against said first shell in said central depression, and a flexible gasket passing through said first shell, and said conductors extending through said flexible gasket.

15. The multiple light fixture defined in claim 11, wherein said pod comprises a rectangular receptacle having one side bonded to said dish by said sealant, and an open end through which said LEDs extend.

16. The multiple light fixture defined in claim 11, wherein said shroud comprises a rectangular receptacle having one side bonded to said dish by said sealant, an open end through which said LEDs shine light, and an integral three-sided canopy that projects past said LEDs so as to shield said side marker lens and said tail light lens from the light shined by the LEDs in said shroud.

17. The multiple light fixture defined in claim 11, further comprising, said dish being completely surrounded by an outwardly projecting peripheral rim, and said sealant that covers said first circuit board and said first array of LED's being contained within said peripheral rim.

18. The multiple light fixture defined in claim 11, wherein one side of said pod and one side of said shroud are bonded to said dish by sealant confined within said peripheral rim.

19. The combination comprising a bracket for connecting a license plate to a vehicle and a light fixture for illuminating figures on a license plate:

said bracket comprising a beam having first openings therethrough for receiving fasteners for attaching a license plate to said bracket, an integral flange extending from said beam having second openings therethrough for receiving means for attaching said bracket to a vehicle, and said light fixture comprising a housing having fasteners extending from one side thereof, said fasteners passing through said second openings in said beam for connecting said light fixture to said bracket and attaching the combination to a vehicle with said beam located essentially below said light fixture, said light fixture having a transparent lens in a lower portion thereof above said beam, a plurality of LEDs in said light fixture above said transparent lens, and each of said LEDs being aimed so as to shine directly on a predetermined location on a license plate that is held by said bracket there below.

20. The combination defined in claim 19, wherein said beam extends at an angle to said flange so as to hold an attached license plate at an angle with respect to vertical.

21. The combination defined in claim 19 wherein said flange holds an attached license plate at an acute angle to vertical.

22. The combination defined in claim 19, wherein said housing comprises a first shell having a colored side marker lens on one side thereof, and said transparent lens being on a side of said first shell that is generally perpendicular to said one side of said first shell;

a second shell comprising a colored tail light lens that is generally perpendicular to both said side marker lens and said transparent lens; said second shell having an edge that is sealed against said first shell and said side marker lens and said license plate lens;

a light and circuit module between said first and second shells, said module having a first array of LEDs aimed at said tail light lens, said first array of LEDs being connected to a first printed circuit board, said module having a second array of LEDs aimed at said side marker lens, said second array of LEDs being connected to a second printed circuit board, said plurality of LEDs above said transparent lens being a third array of LEDs in said module aimed at said transparent lens, said third array of LEDs being connected to a third printed circuit board, said first, second and third printed circuit boards being connected to conductors for connecting said light assembly to a vehicle electrical system; and a waterproof sealant covering said first, second and third printed circuit boards and a portion of each LED.

\* \* \* \* \*